US009576089B2

(12) United States Patent
Charlesworth et al.

(10) Patent No.: US 9,576,089 B2
(45) Date of Patent: Feb. 21, 2017

(54) UNIFIED APPLICATION FRAMEWORK FOR FINITE-DIFFERENCE MODELING

(71) Applicants: Oliver Charlesworth, London (GB); Tamas Nemeth, San Ramon, CA (US); Oliver Pell, London (GB); Thor Johnsen, Pleasanton, CA (US); Peeter Akerberg, Walnut Creek, CA (US)

(72) Inventors: Oliver Charlesworth, London (GB); Tamas Nemeth, San Ramon, CA (US); Oliver Pell, London (GB); Thor Johnsen, Pleasanton, CA (US); Peeter Akerberg, Walnut Creek, CA (US)

(73) Assignee: Chevron U.S.A. Inc., San Ramon, CA (US)

( * ) Notice: Subject to any disclaimer, the term of this patent is extended or adjusted under 35 U.S.C. 154(b) by 846 days.

(21) Appl. No.: 14/014,824

(22) Filed: Aug. 30, 2013

(65) Prior Publication Data
US 2015/0066450 A1 Mar. 5, 2015

(51) Int. Cl.
G06F 7/60 (2006.01)
G06F 17/10 (2006.01)
G06F 17/50 (2006.01)
G01V 1/28 (2006.01)

(52) U.S. Cl.
CPC ............. *G06F 17/5018* (2013.01); *G01V 1/28* (2013.01); *G06F 17/5009* (2013.01)

(58) Field of Classification Search
CPC ..... G06F 17/5018; G06F 17/5009; G01V 1/28
USPC ........................................... 703/2, 10; 702/6
See application file for complete search history.

(56) References Cited

U.S. PATENT DOCUMENTS

| 6,173,276 B1 | 1/2001 | Kant et al. |
| 6,772,136 B2 | 8/2004 | Kant et al. |
| 7,548,241 B2 * | 6/2009 | Marshall ................. G06T 17/20 345/428 |

(Continued)

OTHER PUBLICATIONS

Grigoras "Aspect Oriented Design for Dataflow Engines". Jun. 2013. Department of Computing, Imperial College London. 107 pages.*

(Continued)

*Primary Examiner* — Eunhee Kim
(74) *Attorney, Agent, or Firm* — Marie Clapp

(57) ABSTRACT

A finite difference wavefield modeling framework decouples the tasks of physical modeling and hardware-software optimization through the use of a platform-agnostic intermediate representation in the form of a dataflow graph. In at least some embodiments a wavefield simulation method includes specifying a kernel of operations to be applied at each point in a space and representing the kernel as a platform-agnostic dataflow graph. For each of multiple implementation platforms, the method further includes: deriving from the platform-agnostic graph a customized graph for the implementation platform; translating the customized graph into configuration information for the implementation platform; supplying the configuration information to the implementation platform to obtain a wavefield simulator; and employing the wavefield simulator to repeatedly apply said kernel of operations to each point in the space with specified input or output signals.

21 Claims, 4 Drawing Sheets

(56) References Cited

U.S. PATENT DOCUMENTS

2012/0072117 A1* 3/2012 Loddoch ............... G01V 1/301
702/16

OTHER PUBLICATIONS

Pell et al. "Finite-Difference Wave Propagation Modeling on Special-Purpose Dataflow Machines". IEEE Transactions on Parallel and Distributed Systems, vol. 24, No. 5, May 2013.*
Clapp, Robert G., et al.; "Selecting the Right Hardware for Reverse Time Migration"; The Leading Edge, vol. 29, No. 1, Jan. 2010, pp. 48-58.
Brian Calder, et al., "Bayesian Interface Detection in Very Shallow Chirp Seismic Data", pp. 503-507, 1999.
Diego Brandao, et al., "Performance Evaluation of Optimized Implementations of Finite Difference Method for Wave Propagation Problems on GPU Architecture", $22^{nd}$ Intl. Symposium on Computer Architecture and High Performance Computing Workshops, pp. 7-12, 2010.
Jens Krueger, et al., "Hardware/software Co-design for Energy-efficient Seismic Modeling", pp. 1-12, Nov. 2011.
Robert G. Clapp, et al., "Selecting the right hardware for reverse time migration", The Leading Edge, Jan. 2010, pp. 48-57.
PCT Notification of Transmittal of the International Search Report and the Written Opinion of the International Searching Authority, or the Declaration, Dec. 3, 2014, 10 pages.
iWave: a Framework for Regular-Grid Finite Difference Modeling; Symes; HPC in O&G Workshop, Mar. 1, 2012.

* cited by examiner

FIG. 1
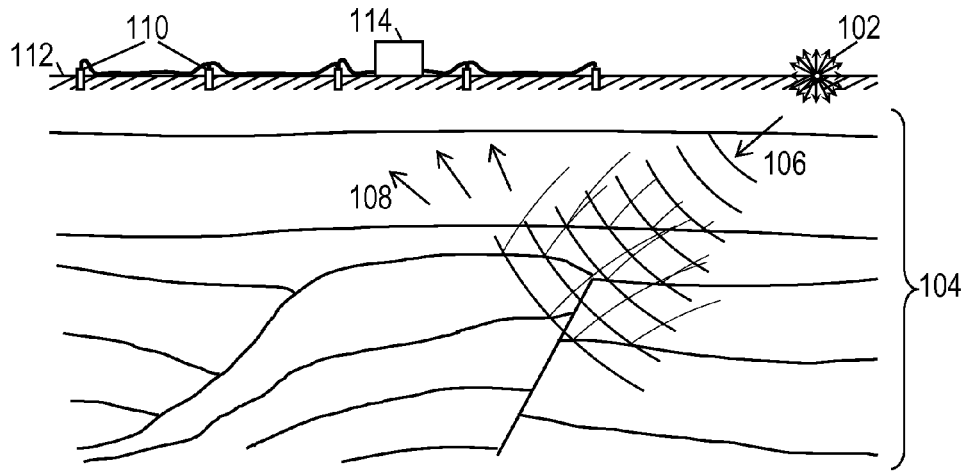
FIG. 2
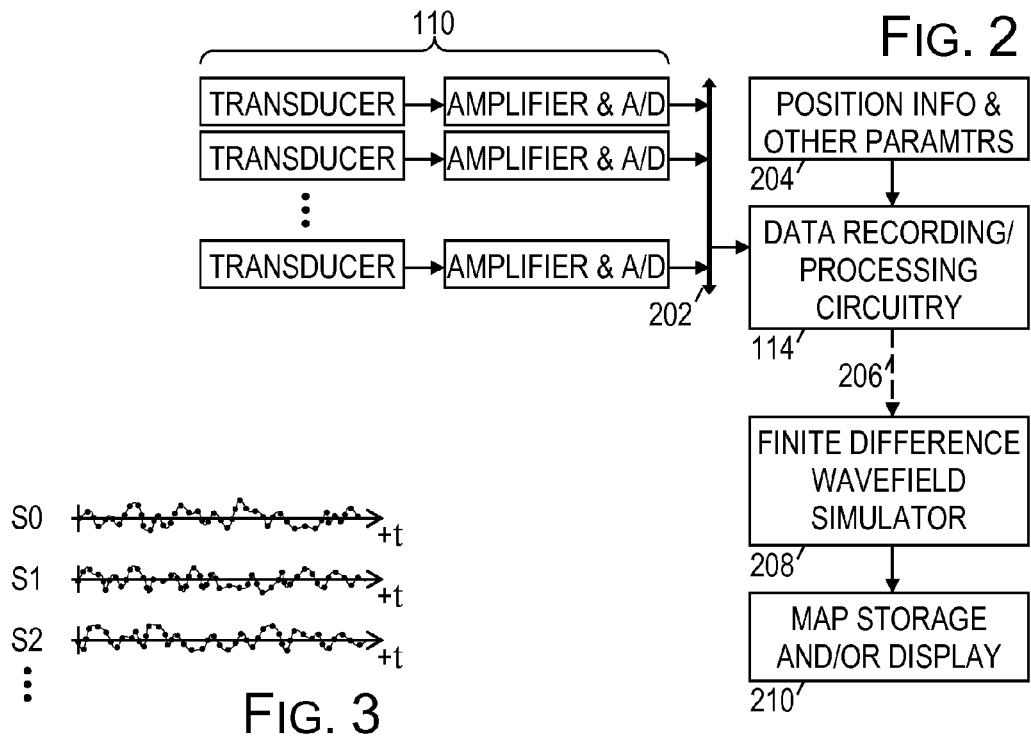
FIG. 3

… … US 9,576,089 B2 …

UNIFIED APPLICATION FRAMEWORK FOR FINITE-DIFFERENCE MODELING

BACKGROUND

Scientists and engineers often employ geophysical surveys for exploration, archeological studies, and engineering projects. Geophysical surveys can provide information about underground structures, including formation boundaries, rock types, and the presence or absence of fluid reservoirs. Such information greatly aids searches for water, geothermal reservoirs, and mineral deposits such as hydrocarbons and ores. Oil companies in particular often invest in extensive seismic and electromagnetic surveys to select sites for exploratory oil wells.

Geophysical surveys can be performed on land or in water. As indicated in FIG. 1, an energy source 102 near the region of interest 104 generates waves 106 that propagate into the region of interest and reflect from internal features such as bed boundaries. Eventually, the reflected waves 108 reach an array of receivers 110 on or near the surface 112 or in a borehole. A recording system 114 captures the received signals for storage and processing. The process is repeated with many different source positions and optionally with different receiver positions. Although various methods exist for converting the received wave signals into an image of the subsurface structure, the most popular such techniques employ finite difference wave field modeling, a process that propagates waves forward or backward in time using discrete time steps and fast approximations of wave function derivatives. With small enough time steps and accurate enough approximations, the finite difference wave field modeling process provides an efficient, high fidelity solution. Nevertheless, the finite difference modeling process imposes a substantial computational demand.

Many efforts have been made to satisfy the computation demands of the finite difference wave field modeling process. Many combined hardware-software solutions have been implemented in the attempt to maximize runtime efficiency. In addition to exploiting different parallelization strategies offered by different hardware systems, the software is often customized to incorporate different earth models, different wave function approximations, and different propagation strategies. These factors lead to a severe fragmentation of the code base, making it difficult to maintain and re-use applications. In many cases, it may be difficult to even compare the results of different applications due to slightly different underlying algorithms or hardware implementations.

BRIEF DESCRIPTION OF THE DRAWING

Accordingly, there are disclosed herein systems and methods employing a unified application framework for finite difference modeling.

FIG. 1 is a schematic depiction of a seismic survey.

FIG. 2 is a block diagram of a seismic survey system having a finite difference wavefield simulator.

FIG. 3 shows illustrative digitized receiver signal traces.

Figure 4:
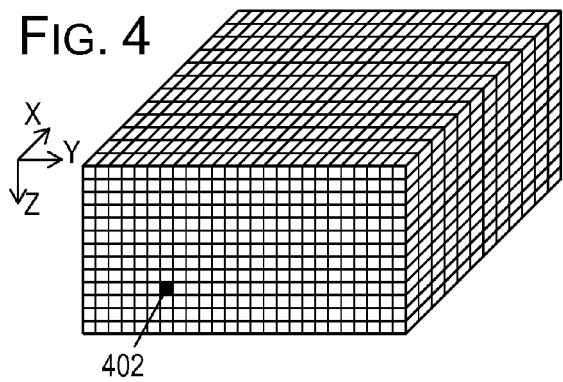
FIG. 4 shows a data space representing a subsurface region of interest.

It should be understood, however, that the specific embodiments given in the drawings and detailed description below do not limit the disclosure. On the contrary, they provide the foundation for one of ordinary skill to discern the alternative forms, equivalents, and other modifications that are encompassed in the scope of the appended claims.

DETAILED DESCRIPTION

The following disclosure presents certain wavefield simulation systems and methods suitable for many uses including seismic imaging on a variety of hardware platforms. Customized software for the various hardware platforms is derivable from a platform-agnostic dataflow graph of a finite difference kernel.

FIG. 2 provides an illustrative context for the disclosed wavefield simulation systems and methods. An array of seismic receivers 110 convert seismic waves to electrical signals that are amplified and digitized. (Illustrative signals are shown in FIG. 3.) A recording system 114 collects the digitized signals via a bus 202 or other communications pathway and stores the digitized signals on an information storage medium for later processing. Typically, each digitized signal is associated with a receiver location and a shot location 204 and such other information as the system designer deems worthwhile. Recording system 114 may perform some initial processing to filter and/or compress the data, and in at least some cases, to perform quality control.

The recording system 114 provides the seismic survey data via the Internet or some other communications mechanism 206 to a data processing center having sufficient computational resources for the imaging process. The data processing center includes one or more computers that act as a finite-difference wavefield simulator 208. While these simulator(s) 208 can be suitably programmed general purpose computers, it is possible to achieve higher efficiencies through the use of specialized hardware such as supercomputers, vector processing units, graphical processing units, field-programmable gate arrays (FPGA), dataflow processors, and combinations thereof. The resulting wavefields are combined to form a map of the subsurface structure which can be displayed on a monitor 210 and stored for later use in persistent storage.

To simulate the wavefield and construct the image, the data processing center models the region of interest as a two-dimensional or three-dimensional space divided into a grid of elements 402. FIG. 4 shows an example of a 3D space. The properties of all of the points within an element are assumed to be uniform and thus can be represented as a single point. The simulator tracks relevant properties (e.g., pressure, sound velocity, anisotropy) on an element-by-element basis.

Figure 5:
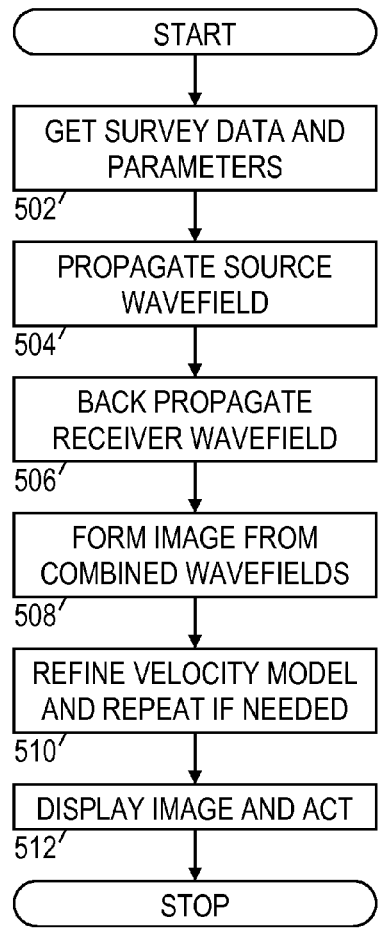
FIG. 5 is a flowchart of an illustrative seismic imaging method.

FIG. 5 is a flowchart of an illustrative seismic imaging method that may be performed by the computers in the data processing center. In block 502, the computers obtain the survey data, including the digitized signals and associated source and receiver position information. An initial model of the subsurface may also be obtained in this block, e.g., to specify an estimated sound velocity as a function of position. Often a uniform velocity model is employed as the starting point and gradually refined during the imaging process.

In block 504, the computers simulate the wavefield generated by the source by propagating the source signal (or a suitable substitute) into the space from the source position. That is, the source generates a pressure wave, a shear wave, and/or other types of waves that propagate outward from the source position in accordance with the wave equation. A finite difference model simulates this propagation to determine the source wavefield, i.e., the pressure or acceleration as a function of time at each point in the model space.

In block 506, a similar operation is applied to the receiver signals. Recognizing that the recorded pressure or accelerations reached the receiver locations, these pressures or accelerations are propagated backward in time into the model space in accordance with the wave equation. The same finite difference propagation model as before can be used, albeit with a reversed time index, to determine the receiver wavefield. (With the time reversal, receiver waveforms get treated like source waveforms.) Because reflectors in the earth convert the source wavefield into the receiver wavefield, these two wavefields match at the reflection points. Accordingly, the source and receiver wavefields are analyzed as a function of time and position in block 508 to identify those regions that match and hence indicate a reflection point. This process is repeated for each seismic shot and the matching information is added up ("stacked") to image the whole region of interest.

In block 510, the image is analyzed to identify inaccuracies in the estimated velocity. Since such inaccuracies produce certain patterns in the image data, they enable the velocity model to be refined. Blocks 504-510 can be iteratively repeated to gradually refine and improve the velocity model (and the resulting images). Once the velocity model converges, the computers can display the image in block 512. Actions can then be taken based on the displayed image, including steering decisions, landing decisions, and completion decisions.

A particular point of note is that the imaging process may need to be repeated many times before convergence is reached, and each iteration of the imaging process requires the solution of the propagation equation at each point in the model space for each time step for each shot. Hence the finite difference propagation process may necessitate hundreds of billions of calculations. Fortunately, the process includes a significant degree of parallelism, and a number of hardware platforms have been developed to increase the efficiency of the process. Benefits of such efficiency gains in the propagation process are not limited to imaging. For example, finite difference modeling can also be employed to generate synthetic shot gather data for simulation purposes.

Figure 6:
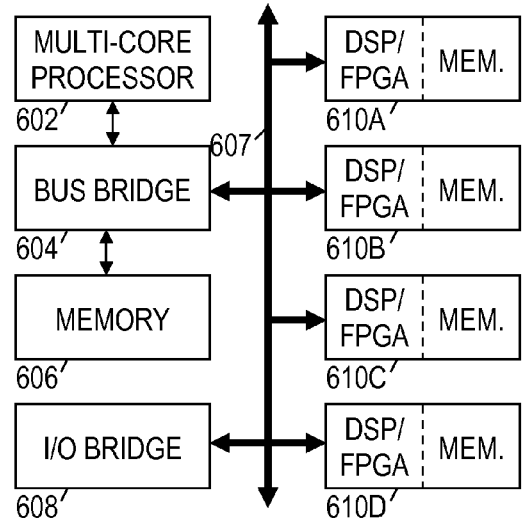
FIG. 6 is a block diagram of an illustrative hardware platform suitable for implementing finite-difference wavefield modeling.

FIG. 6 is a block diagram of an illustrative hardware platform suitable for implementing finite-difference wavefield modeling. One or more multi-core processors 602 coordinate the operation of the system based on software stored in memory 606 and/or in persistent storage accessible via an I/O bridge 608. A bus bridge 604 couples the processor(s) 602 and memory 606 to the rest of the system via a bus 607. Various peripherals can be coupled to the bus to be made accessible to the processor(s) 602. The illustrated platform includes a set of accelerator cards 610A-610D having configurable processors and large memories for storing model data. The accelerator cards may further include field-programmable gate arrays (FPGA) that can provide a pipelined hardware implementation of the finite difference propagation process. The processor(s) 602 can configure the accelerator cards for efficient implementation of the wavefield migration and run them in parallel (e.g., on different parts of the model space or on different shots).

Figure 7:
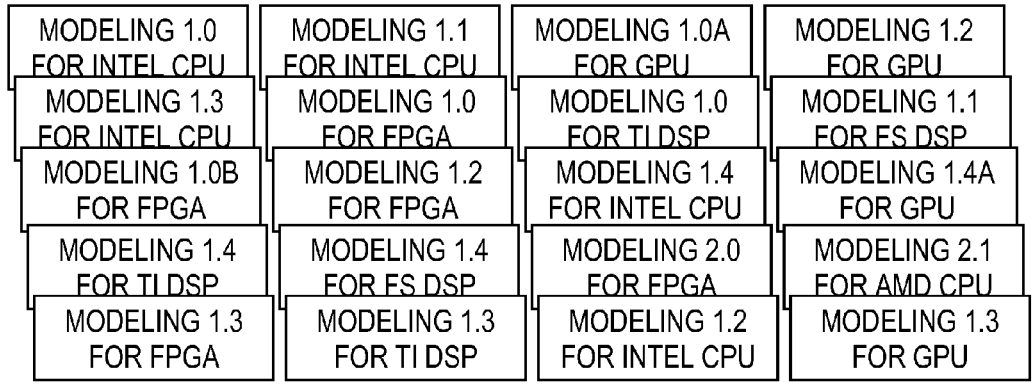
FIG. 7 illustrates a characteristic form of code base fragmentation.

Other hardware platforms may provide different implementations of the migration process, e.g., employing graphic processor units (GPU), coprocessors such as the Intel® Xeon Phi™ Coprocessor, or other vectorized processors to implement single-instruction multiple data (SIMD) computations, or relying on general purpose processors for testing new algorithms. Many "general purpose" processors now include support for SIMD instructions, e.g., Streaming SIMD Extensions (SSE) and Advanced Vector Extensions (AVX), each requiring their own manufacturer-specific optimizations. As a natural consequence of this, code fragmentation tends to occur. FIG. 7 represents seven different migration processes (e.g., processes for different approximations, different optimizations, and/or different formation models such as isotropic, vertical transverse isotropic (VTI), tilted transverse isotropic (TTI), or fully anisotropic) which have fragmented into over 20 software packages due to the various customizations for five different platforms. Maintenance of such a fractured code base is infeasible.

Figure 8:
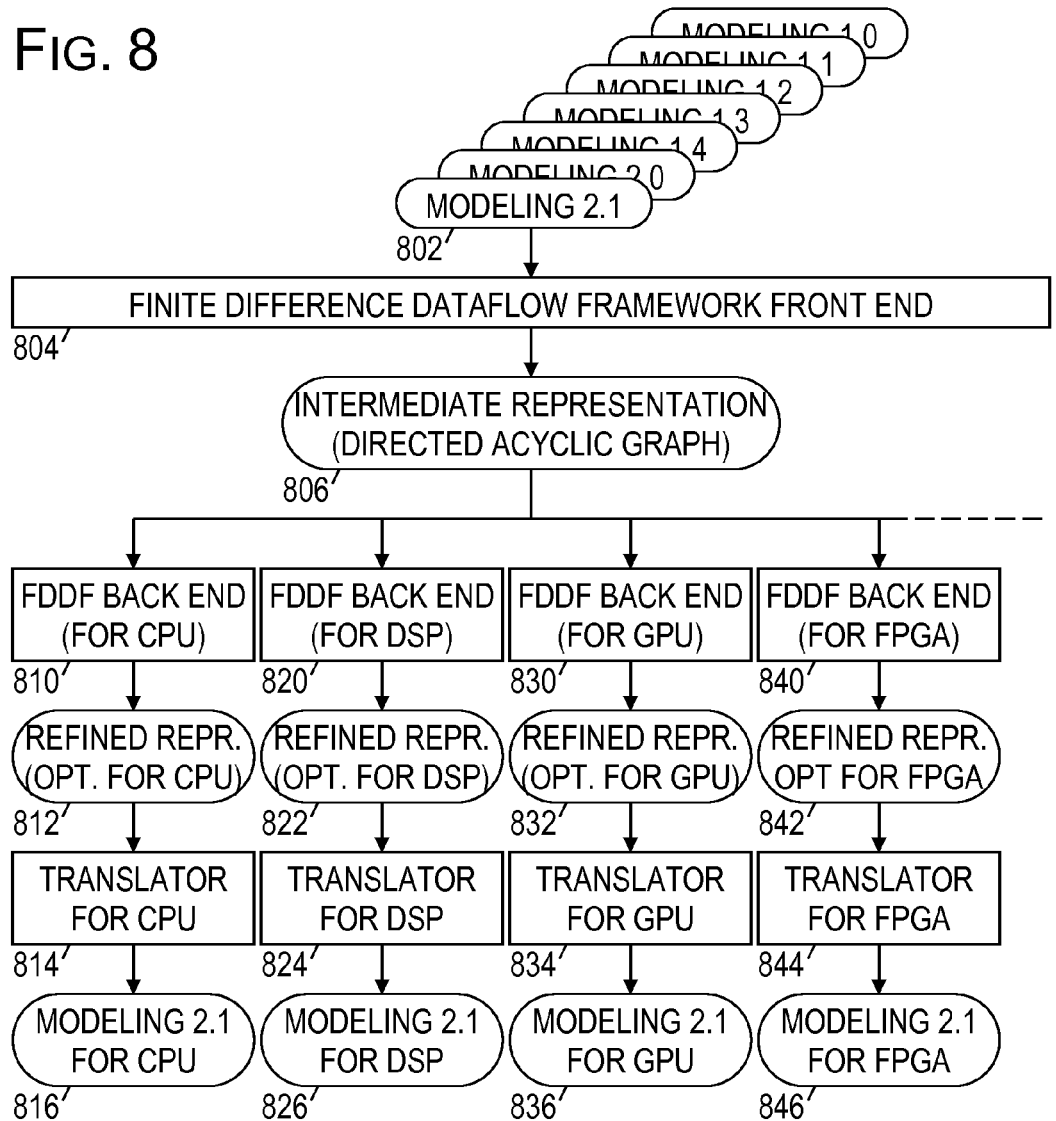
FIG. 8 illustrates a unified application framework for finite difference modeling.

By contrast, FIG. 8 illustrates a unified application framework for finite-difference modeling, which enables a single finite-difference modeling application 802 to be platform agnostic and yet still be translated into efficient, platform-specific programs 816, 826, 836, 846. The framework enables an application developer to specify the propagation "kernel", which describes the finite difference calculations to be performed at each time step at each point in the model. The developer can employ a domain-specific language having useful functions and keywords for this purpose. A front end module 804 converts this kernel into an intermediate representation ("IR") characterizing the dataflow in terms of a directed, acyclic graph. One of a set of platform-specific back end modules 810, 820, 830, 840, performs one or more optimization passes on the intermediate representation to obtain a refined, or customized, representation 812, 822, 832, 842, which is a dataflow graph that has been optimized for the given platform. A corresponding translator module 814, 824, 834, 844, translates the customized representation into platform specific programs 816, 826, 836, 846, which may take the form of configuration information, customized source code, object libraries, and/or fully linked executable binaries. Taken together the back end and translator modules for a given platform may be termed a "builder" module, and in at least some embodiments, they are combined into a single executable module. A host application may integrate with, link with, or cooperate with the platform-specific programs. For example, the host program may download the platform-specific program onto accelerator boards to configure them as the main implementation component for the propagation process.

In this manner, the framework enables the specification and optimization of the propagation kernel to be performed independently of the optimization process for the chosen hardware platforms. The utility of this flows from the many scenarios that may have to be addressed by the application developer (e.g. physical model complexity, different algorithmic choices) and the many developments that are occurring in the design of heterogeneous hardware architectures to provide better computational efficiencies than homogeneous or general purpose architectures. Typically, these skill sets are held by different people, e.g., the geophysicist vs. the computer scientist, and the hardware platforms have a much shorter life cycle (2-3 years) than that achievable by well-maintained software. The platform agnostic, domain specific language provides a separation of the physics modelling from the hardware-software optimization problem, enabling developers to encapsulate and extend their propagation kernel strategies, aided by the existence of a unified code base that enables the use of one kernel for each approximation of the underlying physics. Optimization experts can focus on accelerating the well-defined structures/paradigms independently from the hardware development cycle. Direct comparisons can be made between hardware platforms for every kernel in the code base.

The intermediate representation characterizes the kernel dataflow as a directed acyclic graph having nodes representing results of operations and directed edges connecting the nodes to represent dependencies between the nodes. The edges entering a note represent input to that node, and the edges leaving a node represent the output from that node. Nodes without input edges are source nodes representing values drawn from an external source. Nodes without output edges are sink nodes representing values being sent to external destinations.

Figure 9:
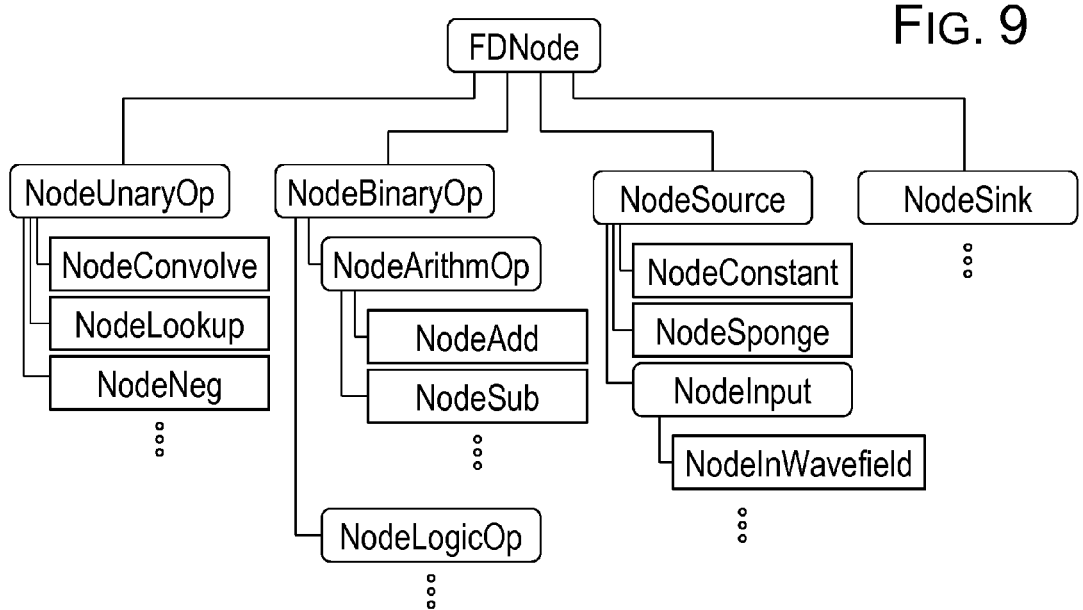
FIG. 9 shows a hierarchy of illustrative node types suitable for use in a dataflow-based intermediate representation.

As indicated in FIG. 9, the intermediate representation can employ a variety of node types. The various types are presented here as a (partial) object-oriented class hierarchy. The abstract types are shown with rounded corners, the concrete types employable in a intermediate representation graph are shown with square corners. For example, the abstract Finite Difference Node (FDNode) type is shown at the top of the figure, with four abstract types depending from it: a Unary Operation Node (NodeUnaryOp), a Binary Operation Node (NodeBinaryOp), a Source Node, and a Sink Node. Examples of the Unary Node type include three concrete types: Negation, Lookup, and Convolution. Negation is self-explanatory. Lookup is a table lookup using the input data as an index into the table. Convolution applies a convolution (filter) template to the input data. Binary Operation Node includes both arithmetic operations (addition, subtraction, multiplication, etc) and logical operations (AND, OR, XOR, etc). Source Node types include constant values, "sponge" templates (useful for attenuating artifacts from boundaries of the model space), model space attributes (e.g., the acoustic velocity as a function of position in the model space), and input wavefields (e.g., the current pressure at each position in the model space). Input and output wavefield nodes may be used to specify decompression/compression techniques and memory buffers for storing wavefield information between time steps.

The majority of nodes types operate on each input data point independently of the other data points. That is, representing each point in a 3D model space by its XYZ coordinates i,j,k, the function $f$ of a node to produce output y can be expressed as follows:

$$y_{i,j,k} = f(a_{i,j,k}, b_{i,j,k}, c_{i,j,k}, \ldots)$$

where a, b, c, etc. are inputs, and y is the output. Nodes representing standard arithmetic, logical and relational operators fall into this category. However, some nodes may provide dependencies on other data points. For example, NodeConvolve performs a 1, 2, or 3D spatial convolution on a wavefield using a template that can be selected from a variety of stencil shapes or specified with arbitrary coefficient values. NodeOffset performs a spatial shift, e.g., $$y_{i,j,k} = a_{(i+dx),(j+dy),(k+dz)}$$

High level nodes may also be provided, such as NodeSponge—Performs boundary sponging with a runtime-configurable sponge profile. NodeLookup performs a table lookup, i.e., $$y_{i,j,k} = f(a_{i,j,k})$$

where a is an integer, and $f$ is a runtime-configurable lookup function. NodeCounter evaluates to a specified function of the current spatial index, e.g., $$y_{i,j,k} = j$$

NodeMux provides as an output a selected one of the inputs, based on an integer index input. NodeConstant and NodeInputScalar evaluate to compile-time and runtime-configurable constant values, respectively. NodeInputWavefield, NodeOutputWavefield, NodeInputEarthmodel are examples of node types for encapsulating a number of compression and buffering techniques for input and output streams.

Additional node types may be provided by platform-specific back end modules to represent platform-specific concepts or structures and otherwise support the platform-specific optimization process. For example, a DFE backend module might introduce NodeBuffer to represent hardware buffering. The intermediate representation may further incorporate node structures that support back-end manipulation. For example, nodes types may be provided with platform-specific Properties objects that the back end module(s) employ to control code generation on a node-by-node basis. The values of these Properties objects would not be set by the kernel or the front end module. Rather, the rules specified in the platform-specific back end modules would control these values. Of course platform-agnostic node properties may be set by the kernel, e.g., the stencil employed by the convolution node, or the shift employed by an offset node. In addition, the node may specify on an edge-by-edge basis the particular type of data to be transferred on the corresponding input or output edges. Illustrative types may include Boolean, integer, floating point, and expression (for representing subgraphs whose results are intended to be pre-computed for the entire volume, such as for derived earthmodel parameters).

The kernel maps out the operations that are performed during a single time step for all points in the model space. A time step consists of configuring one or more source nodes with new runtime data, recalculating the outputs for each node in the graph, and collecting new runtime data from one or more sink nodes. The loop to repeat the kernel for all time steps is implemented in an outer structure.

As an example, consider a $2^{nd}$-order isotropic model, governed by the following wave equation:

$$\frac{\partial^2 p}{\partial t^2} = v^2 \nabla^2 p + s(t)$$

Converted to a finite-difference approximation and expressed in pseudocode with appropriate boundary sponging, the wave equation becomes:

foreach(x, y, z): laplacian := convolve(p[x, y, z], stencil)pp_out[x, y, z] :=

2 * p[x, y, z] − pp[x, y, z] + dvv[x, y, z] * laplacian + source[x, y, z]

apply_boundary_sponge(p)apply_boundary_sponge(pp_out)

In words, convolution of the present pressure field p[x,y,z] with a suitable stencil is used to approximate the Laplacian at each point (x,y,z) in the model space. An output pressure field pp_out is calculated at each point based on present pressure field p[x,y,z], the previous pressure field pp[x,y,z], the squared velocity dvv[x,y,z], the Laplacian, and the source energy. A boundary sponge is then applied to the present pressure field and the output pressure field to suppress boundary artifacts.

The application developer can then draft the source code using a domain specific language that includes representations of each node type available in the intermediate representation. That is, the application developer is able to represent the propagation portion of their application as a concise dataflow description rather than as conventional procedural code. The domain specific language is complete in that the application developer is able to code for every possible operation without having to account for hardware-specific details. The consequence of this design is the decoupling of physical modelling from hardware-software optimization, as discussed further below. The developer need not concern themselves with procedural issues such as looping over the problem domain, as the kernel's dataflow description is implicitly applied in parallel to every point in the model space. We note that the resulting code closely mirrors the pseudocode expression of the discretized wave equation above. In this example the source code becomes:

```
// Wavefields from previous two timesteps
FDVar p = io.waveFieldInput("p", 1.0 , 6 /*halo*/);
FDVar pp = io.waveFieldInput("pp", 1.0, 0);
// Earthmodel (velocity squared)
FDVar dvv = io.earthModelInput("dvv", 1.0 / 4.0, 0);
// Source function
FDVar source = io.hostInput("source_in", 1.0, 0);
// Boundary conditions (sponging boundary)
FDVar sponge = boundaries.sponge(30);
// Calculate Laplacian as a convolution in all axes
FDVar laplacian = p.convolve(ConvolveAxes.XYZ, myStencil);
// Difference equation, source injection, and sponging
FDVar result = p * 2 - pp * sponge + dvv * laplacian + source;
result = result * sponge;
// Output
io.hostOutput("receiver", result);
io.waveFieldOutput("pp_out", result);
```

Notable differences include the specification of variable types and the use Java object-like syntax for specifying parameters of input and output streams. For optimization reasons, the sponging operation is implemented in a different sequence relative to the pseudocode. Finally, note that the loop structure is omitted from the kernel.

Figure 10:
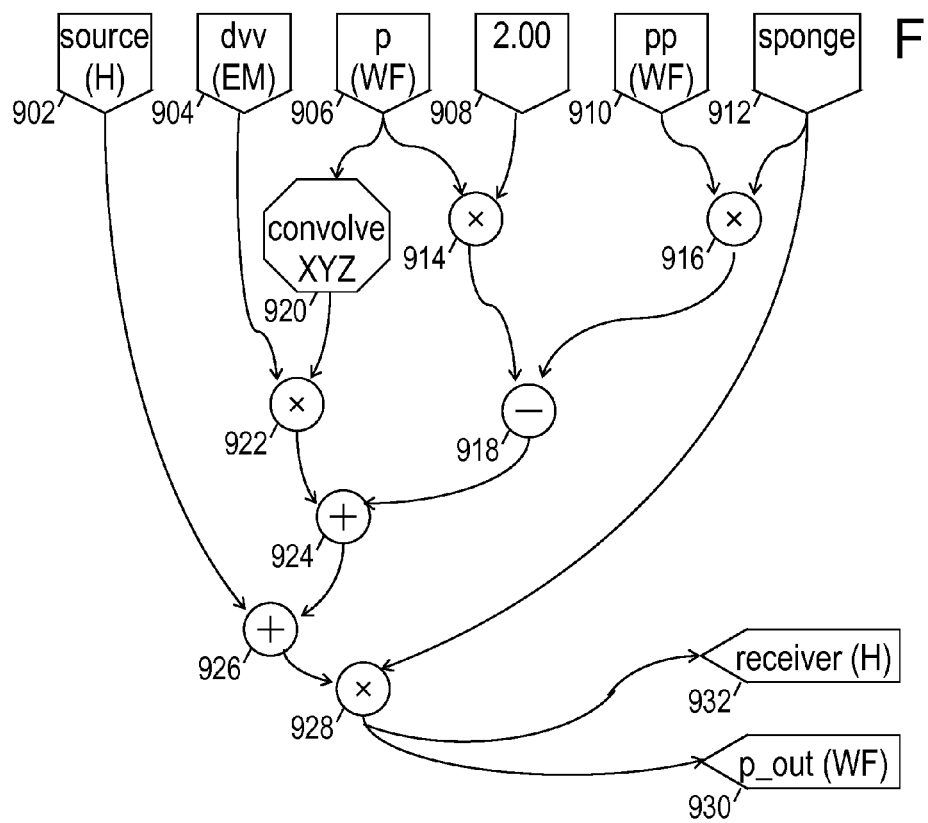
FIG. 10 shows an illustrative dataflow-based intermediate representation.

FIG. 10 shows the intermediate representation of this source code in dataflow form, i.e. as a directed graph. It has six source nodes 902-912, eight operations nodes 914-928, and two sink nodes 930-932. Node 902 is a host-input node that accepts a source stream. Node 904 is an earth-model input node that accepts the squared velocity attribute for each point in the model space. Node 906 is the present pressure wavefield input node. Node 908 is a constant value input node. Node 910 is a previous pressure wavefield input node. Node 912 is a sponge input node that provides attenuation around the boundaries of the model space.

Node 914 produces the product of the constant from node 908 and the present pressure wavefield value from node 906. Node 916 produces the product of the previous pressure wavefield value from node 910 and the sponge coefficient from node 912. Node 918 produces the difference of the products from nodes 914 and 916. Node 920 is a convolution node that operates on the present pressure wavefield to produce a Laplacian. Node 922 produces the product of the Laplacian with the squared velocity attribute from node 904. Node 924 produces the sum of the values from nodes 918 and 922. Node 926 combines that sum with the source input value from node 902 to obtain an update pressure wavefield value. Node 928 produces the product of the updated pressure wavefield value with the sponge coefficient.

Sink node 930 collects the output of node 928 for storage as the output pressure wavefield. Sink node 932 also collects that output for provision to the host as a receiver signal.

The framework may offer an API mechanism that enables platform-specific optimizations on a node-by-node basis whilst minimizing pollution of the application kernel code. This mechanism is the setting of node properties with platform-specific "rules" that may be applied by the platform-specific back end module. A rule specifies a property-manipulation action, known as a functor, to a subset of the dataflow graph, known as a group. Groups may be defined based on node type to facilitate optimization of certain operations. Each backend module may specify any number of custom functors; typically each will set one or more node properties. For example, the backend module may specify an integer-valued node property foo, and a method setFoo(int foo) for applying the associated functor. Functors may be combined to create higher-level functors. For example, is(NodeConvolve.class)>>setFoo(3) uses the pre-defined "is" functor to create a new functor which sets the foo property to 3 if the node represents a convolution. This API mechanism facilitates the division of labor between the computer scientists and the geophysicists, enabling each to focus on their own competencies.

The framework may also offer an API mechanism for inspection and manipulation of the intermediate representation. Platform-specific back end modules may employ the API to apply transformations to the dataflow graph, similar to those performed during compiler graph passes. Graph passes are typically used for: Graph inspection (for example generating a visual representation), Optimization (for example replacing a multiplication-by-2 with a left-shift), Platform-specific manipulation (for example inserting buffers for a DFE implementation), and Final target rendering. The API mechanism enable customized graph-passes to be defined and registered for use in performing platform-specific optimization of an intermediate representation.

A graph-pass can register handler methods for as many node types as desired. The appropriate handlers can then be invoked automatically by the back end module as appropriate. By default, the nodes may be visited in topological order (meaning that a node will not be visited until all of its upstream nodes have been visited). However other orders can be specified for each graph pass, including reverse order, ordering by type, and by list index (for arbitrary processing).

Some framework embodiments may further offer an API mechanism for evaluating a number of hardware targets with respect to a given physics kernel, thereby facilitating the evaluation of future hardware platforms and the associated purchase and management decisions.

The framework disclosed herein employs a domain-specific language that is formulated based on a platform-agnostic intermediate representation suitable for specifying a finite difference modeling kernel. This framework decouples the tasks of physical modeling and hardware-software optimization. It imposes a physics-based meta-structure for the code base and yields a code design that is very portable and amenable to subsequent optimization. Maintenance of the code base is facilitated because the developer can direct their attention to the kernel. To the extent that platform-specific refinements are desired, they can be accommodated by the platform-specific back end module and/or the platform-specific translator module, enabling these refinements to be applied uniformly across all kernels as needed for that platform. This framework further facilitates direct comparisons between performances of the various platforms, as they are each implementing a common kernel.

Numerous other variations and modifications will become apparent to those skilled in the art once the above disclosure is fully appreciated. It is intended that the following claims be interpreted to embrace all such variations and modifications.

What is claimed is:

1. A wavefield simulation method that comprises:
specifying a kernel of operations to be applied at each point in a space;
representing the kernel as a platform-agnostic directed acyclic graph with nodes representing results of operations and with edges representing dependencies; and
for each of multiple implementation platforms:
deriving from the platform-agnostic graph a customized graph for the implementation platform, wherein said deriving includes performing graph-based optimization;
translating the customized graph into configuration information for the implementation platform;
supplying the configuration information to the implementation platform to obtain a wavefield simulator; and
employing the wavefield simulator to repeatedly apply said kernel of operations to each point in the space with specified input or output signals.

2. The method of claim 1, wherein the signals comprise a seismic shot or a received seismic waveform.

3. The method of claim 1, further comprising generating an image based at least in part on a wavefield provided by the wavefield simulator.

4. The method of claim 1, wherein the kernel of operations implements a finite-difference timestep.

5. The method of claim 1, wherein the configuration information comprises executable software or firmware instructions for a processor, coprocessor, or graphic processor unit (GPU).

6. The method of claim 1, wherein the configuration information comprises dataflow specifications for a field-programmable gate array (FPGA), programmable logic device (PLD), or application-specific integrated circuit (ASIC).

7. The method of claim 1, wherein the space has three spatial dimensions.

8. The method of claim 1, wherein said graph-based optimization includes splitting graph operations into groups and applying platform-specific rules to at least one of the groups to exploit hardware-specific properties.

9. A finite difference modeling system that comprises:
a non-transient information storage medium having a builder module for each of multiple implementation platforms; and
one or more processors coupled to the information storage medium to execute the builder modules, wherein each builder module causes the one or more processors to:
obtain a platform-agnostic dataflow graph of a finite difference kernel;
derive a platform-customized dataflow graph from the platform-agnostic graph with one or more optimization passes on the platform-agnostic graph; and
translate the platform-customized dataflow graph into configuration information that causes the associated platform to apply the kernel to each point in a model space while accommodating specified transducer signals.

10. The system of claim 9, wherein the signals comprise a seismic shot or a received seismic waveform.

11. The system of claim 9, further comprising a monitor that displays an image based at least in part on a wavefield provided by the wavefield simulator.

12. The system of claim 9, wherein the kernel of operations implements a finite-difference timestep.

13. The system of claim 9, wherein the configuration information comprises executable software or firmware instructions for a processor, coprocessor, or graphic processor unit (GPU).

14. The system of claim 9, wherein the configuration information comprises dataflow specifications for a field-programmable gate array (FPGA), programmable logic device (PLD), or application-specific integrated circuit (ASIC).

15. The system of claim 9, wherein the space has three spatial dimensions.

16. The system of claim 9, wherein as part of said optimization, each builder module processes groups of graph nodes to exploit hardware-specific properties.

17. A seismic imaging system that comprises:
multiple configurable implementation platforms that, after being provided with platform-specific configuration information, each simulates wavefields in response to specified transducer signals, said wavefields being combinable to form a seismic image of a subsurface region; and
a computer that derives said platform-specific configuration information from a platform-agnostic dataflow graph of a finite-difference kernel and stores said platform-specific configuration information in a non-transient information storage medium.

18. The system of claim 17, wherein the platforms include at least one general purpose multiprocessor computer and at least one heterogeneous computer having multiple configurable hardware accelerators.

19. The system of claim 18, wherein the accelerators include field-programmable gate arrays (FPGA) having a configurable dataflow architecture.

20. The system of claim 18, wherein the accelerators include a graphic processor unit (GPU), a coprocessor, or a digital signal processor (DSP).

21. The system of claim 17, further comprising a general purpose computer that combines the simulated wavefields to obtain a subsurface image.

* * * * *